United States Patent
Tu et al.

(10) Patent No.: US 9,551,596 B2
(45) Date of Patent: Jan. 24, 2017

(54) HIGH-TEMPERATURE-RESISTANT METAL-PACKAGED FIBER BRAGG GRATING SENSOR AND MANUFACTURING METHOD THEREFOR

(71) Applicants: Shandong Tu, Shanghai (CN); Yun Tu, Shanghai (CN); Yihua Qi, Shanghai (CN); Peng Han, Shanghai (CN); Xiancheng Zhang, Shanghai (CN); Fuzhen Xuan, Shanghai (CN)

(72) Inventors: Shandong Tu, Shanghai (CN); Yun Tu, Shanghai (CN); Yihua Qi, Shanghai (CN); Peng Han, Shanghai (CN); Xiancheng Zhang, Shanghai (CN); Fuzhen Xuan, Shanghai (CN)

(73) Assignee: East China University of Science and Technology, Shanghai (CN)

( * ) Notice: Subject to any disclaimer, the term of this patent is extended or adjusted under 35 U.S.C. 154(b) by 235 days.

(21) Appl. No.: 14/417,386

(22) PCT Filed: Nov. 19, 2012

(86) PCT No.: PCT/CN2012/084805
§ 371 (c)(1),
(2) Date: Jan. 26, 2015

(87) PCT Pub. No.: WO2014/015586
PCT Pub. Date: Jan. 30, 2014

(65) Prior Publication Data
US 2015/0247744 A1    Sep. 3, 2015

(30) Foreign Application Priority Data
Jul. 27, 2012 (CN) .......................... 2012 1 0264642

(51) Int. Cl.
*G01D 5/353* (2006.01)
*C23C 14/16* (2006.01)
(Continued)

(52) U.S. Cl.
CPC ............. *G01D 5/353* (2013.01); *C23C 14/165* (2013.01); *C23C 14/35* (2013.01); *C25D 3/04* (2013.01);
(Continued)

(58) Field of Classification Search
CPC .. G01D 5/353; G01D 5/35316; G02B 6/0218; G02B 6/02185; G02B 6/02209; C23C 14/35; C23C 14/165; C25D 3/04; C25D 3/12; C25D 7/00
(Continued)

(56) References Cited

U.S. PATENT DOCUMENTS 6,044,189 A * 3/2000 Miller .................. G02B 6/0218
385/10
6,175,674 B1 * 1/2001 Lin ...................... G02B 6/0218
385/13
(Continued)

FOREIGN PATENT DOCUMENTS

CN 1648702 A 8/2005
CN 101009520 A 8/2007
(Continued)

OTHER PUBLICATIONS

International Search Report, Dated May 2, 2013, 8 Pages.
(Continued)

*Primary Examiner* — Seung C Sohn
(74) *Attorney, Agent, or Firm* — Dickinson Wright PLLC

(57) ABSTRACT

A manufacturing method for a high-temperature-resistant metal-packaged fiber Bragg grating sensor includes using a regenerated fiber Bragg grating obtained via high-tempera-
(Continued)

ture annealing as a sensitive element so that the grating will not be erased when used at high temperature. The method also includes using a magnetron sputtering method which makes an optical fiber and metal combine better to form on the surface of the optical fiber an adhesive layer and a conductive layer, thereby causing little damage to optical fiber because of the absence of the processes of coarsening, sensitization, etc. of electroless plating and the fact that the method is performed in an anhydrous environment. After magnetron sputtering, the method includes using an electroplating method to thicken and deposit a protective layer, and embedding the optical fiber in a flexible-structure metallic substrate through the electroplating method to achieve the all-metal package.

16 Claims, 3 Drawing Sheets

(51) Int. Cl.
| | | |
|---|---|---|
| C23C 14/35 | (2006.01) | |
| C25D 3/04 | (2006.01) | |
| C25D 3/12 | (2006.01) | |
| C25D 7/00 | (2006.01) | |
| G02B 6/02 | (2006.01) | |

(52) U.S. Cl.
CPC . *C25D 3/12* (2013.01); *C25D 7/00* (2013.01); *G01D 5/35316* (2013.01); *G02B 6/0218* (2013.01); *G02B 6/02185* (2013.01); *G02B 6/02209* (2013.01)

(58) Field of Classification Search
USPC .................................. 250/227.14; 385/10–15
See application file for complete search history.

(56) References Cited

U.S. PATENT DOCUMENTS

| | | | |
|---|---|---|---|
| 6,181,851 B1 * | 1/2001 | Pan | G02B 6/0218 385/15 |
| 6,356,683 B1 | 3/2002 | Hu et al. | |
| 6,556,726 B2 * | 4/2003 | Yang | G02B 6/022 385/15 |
| 2002/0141699 A1 | 10/2002 | Lo et al. | |

FOREIGN PATENT DOCUMENTS

| | | |
|---|---|---|
| CN | 200993682 Y | 12/2007 |
| CN | 101097972 A | 1/2008 |
| CN | 102323447 A | 1/2012 |
| JP | 2007164213 A | 6/2007 |
| TW | 586035 B | 5/2004 |

OTHER PUBLICATIONS

Shui, Biao, Study on Sesing Technology of Metal Coating Fiber Bragg Grating, Electronic Technology & Information Science, China Master's Theses Full Text Database (Monthly), Oct. 31, 2012, No. 10, pp. 12-27, ISSN 1674-0246.
Fan, Dian, Experimental Study of Sense Characteristic Based on Metalized Package Fiber Bragg Grating, Chinese Journal of Sensors and Actuators, Aug. 2006, vol. 19, No. 4, pp. 1234-1237, ISSN 1004-1699.

* cited by examiner

HIGH-TEMPERATURE-RESISTANT METAL-PACKAGED FIBER BRAGG GRATING SENSOR AND MANUFACTURING METHOD THEREFOR

CROSS REFERENCE TO RELATED APPLICATION

This U.S. National Stage Patent Application claims the benefit of International Application Serial No. PCT/CN2012/084805 filed on Nov. 19, 2012, the entire disclosure of which is incorporated herein by reference.

BACKGROUND OF THE INVENTION

1. Field of the Invention

The present invention is related to a high-temperature-resistant metal-packaged fiber Bragg grating sensor and manufacturing method thereof.

2. Description of Related Art

Optical fiber sensors are used for detecting changes in light transmission characteristics when light propagates through optical fibers being modulated by the environmental effects (physical parameters, chemical parameters, biological parameters, etc.) where all or parts of the optical fibers are located. Optical fiber sensors are widely used in various industries due to their many advantages, such as small size, light weight, high accuracy and sensitivity, immunity to electromagnetic interference and radiation, corrosion resistance, fire prevention, explosion proof, and long service life.

Fiber grating sensor based on wavelength modulation is a type of optical fiber sensors. A fiber grating sensor is to monitor a shift in wavelength which is sensitive to changes in the measurand (physical parameters, chemical parameters, biological parameters, etc). In addition to all the advantages attributed to optical fiber sensors, wavelength encoded fiber grating sensors have an inherent self-referencing capability and a wavelength multiplexing capacity. Accordingly, they can be easily multiplexed in a single fiber spliced to telecommunication fibers for distributed sensing, remote sensing and multi-parameter sensing. Also, the fiber grating sensors can be distributed embedded into materials to create "smart materials". At present, the fiber grating sensors have a wide range of applications in civil engineering, wind power, composite materials, etc.

The most common fiber Bragg grating (FBG) is the most widely used fiber grating, which consists of a periodic modulation of the refractive index in the core of a short segment of a single-mode optical fiber. These types of uniform fiber gratings, where the phase fronts are perpendicular to the fiber longitudinal axis, have constant grating pitch and index modulation amplitude. Light guided along the core of an optical fiber will be scattered by each grating plane. If the Bragg condition is not satisfied, the reflected light from each of the subsequent planes becomes progressively out of phase and will eventually cancel out. Where the Bragg condition is satisfied, the contributions of reflected light from each grating plane add constructively in the backward direction to form a back-reflected peak with a center wavelength namely Bragg wavelength. According to Maxwell's equations and the coupled-mode theory, the Bragg wavelength $\lambda_B$ can be expressed as $$\lambda_B = 2n_{eff}\Lambda \quad (1)$$

where $n_{eff}$ is the effective refractive index of fiber core, and $\Lambda$ is the grating pitch.

According to the equation (1), the Bragg wavelength $\lambda_B$ depends on the effective refractive index $n_{eff}$ of the fiber core and the periodicity of the grating $\Lambda$. The effective refractive index, as well as the periodic pitch between the Bragg grating planes, will be affected by changes in temperature and strain. The change in the effective refractive index $n_{eff}$ is related to the thermo-optic effect and stain-optic effect induced by changes in temperature and strain, as well as the change in grating pitch $\Lambda$ is related to thermal expansion and mechanical deformation induced by changes in temperature and strain. Accordingly, the measurement of temperature, stress/strain can be achieved by monitoring the changes in the Bragg wavelength $\lambda_B$ for structural integrity monitoring.

Up to now, many research projects and applications of fiber Bragg grating sensors have been undertaken in the fields of civil engineering, wind power, composite materials, etc., where fiber Bragg grating sensors is relatively easy to be attached onto surfaces of components or embed into them due to fabrication and operation of the components at relative low temperature. However, in fields of nuclear power, thermal power, petrochemical industry, aerospace industry and so on, where measured metallic components are mostly operated at high temperature, common fiber Bragg grating sensors have obvious disadvantages as follows:

1) Reflectivity of conventional fiber Bragg gratings start to decay when the temperature is above 200° C. and the gratings are "erased" completely when up to 680° C. So conventional fiber Bragg grating sensors can only be used below 200° C.

2) During fabrication of gratings, polymer coatings on surfaces of the optical fibers are always removed so that the optical fibers are exposed to moisture and easily to be mechanically damaged resulting in crack formation on the surfaces, which causes the strength of optical fiber decreases. So the optical fibers must be recoated and packaged after inscribing gratings. Normally, it is mainly organic polymer materials which are used to recoat and packaged fiber Bragg gratings, for example, Chinese patent application No. 201110135194.2 discloses a metal-packaged fiber grating sensor and manufacturing method thereof. The disadvantages of polymer materials, such as ageing and creep, restrict the performance of sensors thus hard to survive in the damp and hot environment. When it is above their normal work temperature, the polymer materials will soften and even decompose to generate hydrogen gas which has a stress corrosion effect on silica optical fibers thereby accelerate fatigue of the silica optical fibers. When it is above 400° C., the polymer materials decompose completely so that optical fibers lose their protection in harsh environment and easily form cracks on their surfaces under thermal-mechanical loading. As time goes by, the cracks grow slowly which results in a decrease in the strength and eventually causes fracture of the optical fiber. Apparently, it is hard to monitor high-temperature components for a long time based on conventional fiber Bragg grating sensors.

3) Conventional fiber Bragg grating sensors and components to be monitored are usually connected by organic adhesive. While, the organic adhesive will produce measurement redundancy, lower strain transfer efficiency, poor linearity, poor repeatability and poor long-term reliability. With increasing in temperature, the organic adhesive accelerates its ageing and further starts to soften and even decompose when up to more than 250° C. Thus the connection between the sensors and the high-temperature components could hardly be achieved.

4) Low thermo-optic coefficient and thermal expansion coefficient of silica (SiO$_2$) optical fiber result in the low temperature sensitivity of bare fiber Bragg grating sensors.

Accordingly, for effectively monitoring metallic components at high temperature for a long time, not only fiber Bragg gratings itself but also metallic package should survive at high temperatures to achieve. So that it can be embedded into metallic components to be monitored or attached on surfaces of them by welding.

To meet the requirements of application in high temperature, many techniques have been proposed to increase the thermal stability of the gratings, including inscribing gratings in specially doped fibers, etching the grating into the flat surface of a D-shaped optical fiber, inscribing gratings with femtosecond laser, etc. However, the specially doped optical fibers are expensive, etching gratings on surfaces requires high accuracy and the corresponding packaging is very difficult since the grating is etched on the cladding and the femtosecond laser costs too much.

Currently, it is commonly used to achieve the metallization of optical fibers including casting, laser cladding, electroless plating, combination of electroless plating and electroplating, vacuum evaporation and so on. Casting and laser cladding have a lot of restriction on coated metals, wherein metals with low melting points cannot meet the requirement of high temperature application; and metals with high melting points have too high melting temperature under which optical fiber gratings are easily damaged and would cause high thermal stress leading to fracture of optical fibers. Furthermore, both of the two methods cannot ensure a metallic coating uniformly deposited on the surface of a grating along an axial direction thereof so that polarization phenomenon occurs and influences spectral shape. The electroless plating methods are provided by, for example, CN200410061378.9 named by "a metalized packaging structure of an optical fiber sensitive element and method thereof", CN200510020086.5 named by "a wet-chemical metallization process of a surface of a silica optical fiber", and CN201010504623.4 named by "a method of electroless plating on a surface of a silica optical fiber". The combination methods of electroless plating and electroplating are provided by, for example, CN02816378.8 named by "a metal-plated optical fiber", and CN03804115.4 named by "a metal-coated optical fiber". The bonding between the coatings obtained from electroless plating and the optical fibers is poor and the coatings have poor uniformity, which cannot meet the requirements of high sensitivity sensors. Moreover, the coarsening and sensitizing process during pretreatment of the electroless plating will damage surfaces of the optical fibers and reduce strength of the optical fibers. Further, the strength of the optical fibers decreases significantly since the optical fibers are directly exposed to corrosive plating solutions containing water, acid and alkali during electroless plating. A bonding force between coating and a substrate surface is weak during vacuum evaporation, and it is difficult to deposit a coating with a high melting point under low vapor pressure, and crucible materials for evaporating substance will evaporate and become impurities mixed into the coating. Also, the coating obtained from vacuum evaporation is too thin to sufficiently protect the optical fibers and transfer strain from the measured components to optical fibers.

SUMMARY OF THE INVENTION

An object of the present invention is to provide a high-temperature-resistant metal-packaged fiber Bragg grating sensor, which is adapted to reliably working under high temperature for a long time and has high temperature sensitivity, strain sensitivity and strain transfer efficiency.

Another object of the present invention is to provide a manufacturing method for a high-temperature-resistant metal-packaged fiber Bragg grating sensor. The method includes following steps: 1) annealing being performed on a fiber Bragg grating to obtain a regenerated fiber Bragg grating; 2) depositing in turn an adhesive layer by magnetron sputtering, a conductive layer by magnetron sputtering and a protective layer by electroplating on a surface of the regenerated fiber Bragg grating; 3) fixedly connecting the regenerated fiber Bragg grating obtained in the step 2) to a metallic substrate to obtain the fiber Bragg grating sensor.

In the above step 2), the adhesive layer is deposited by magnetron sputtering titanium or chromium, the conductive layer is deposited by magnetron sputtering silver, gold or molybdenum, and the protective layer is deposited by electroplating nickel or chromium.

In the step 2), process parameters for magnetron sputtering titanium and silver are as follows:

|  | Sputtering power (W) | Gas pressure (Pa) | Temperature (° C.) | Time (min) |
| --- | --- | --- | --- | --- |
| magnetron sputtering titanium | 120-180 | 0.5-0.8 | Room temperature | 60-150 |
| magnetron sputtering silver | 70-90 | 0.4-0.75 | Room temperature | 10-60 |

In the step 2), process parameters for electroplating nickel are as follows:

| | |
| --- | --- |
| Concentration of nickel sulfate hexahydrate (g/L) | 250-300 |
| Concentration of nickel chloride hexahydrate (g/L) | 20-40 |
| Concentration of boric acid (g/L) | 35-40 |
| Concentration of sodium dodecyl sulfate (g/L) | 0.3-2 |
| Temperature of plating solution (° C.) | 25-35 |
| Electric current density (A/dm$^2$) | 6-12 |
| Electroplating time (min) | 30-300 |

In the step 3), it is by electroplating to fixedly connect the regenerated fiber Bragg grating obtained in the step 2) to the metallic substrate.

In the step 3), process parameters for electroplating are as follows:

| | |
| --- | --- |
| Concentration of nickel sulfate hexahydrate (g/L) | 250-300 |
| Concentration of nickel chloride hexahydrate (g/L) | 20-40 |
| Concentration of boric acid (g/L) | 35-40 |
| Concentration of sodium dodecyl sulfate (g/L) | 0.3-2 |
| Temperature of plating solution (° C.) | 25-55 |
| Electric current density (A/dm$^2$) | 1-5 |

In the step 3), it is by brazing to fixedly connect the regenerated fiber Bragg grating obtained in the step 2) to the metallic substrate.

In the step (1), process parameters for annealing are as follows:

| Annealing temperature (° C.) | Annealing time (min) |
| --- | --- |
| 850-1000 | 30-120 |

A high-temperature-resistant metal-packaged fiber Bragg grating sensor manufactured by the above method includes a regenerated fiber Bragg grating, on surface of which an adhesive layer, a conductive layer and a protective layer are deposited in turn; and a metallic substrate fixedly connected with the regenerated fiber Bragg grating.

Wherein, the adhesive layer is a titanium layer or a chromium layer, the conductive layer is silver, gold or a molybdenum layer, and the protective layer is a nickel layer or a chromium layer.

The metallic substrate has a flexible structure.

The metallic substrate is made of heat-resistant steel or high-temperature alloy.

The high-temperature-resistant metal-packaged fiber Bragg grating sensor and manufacturing method of the present invention uses the regenerated fiber Bragg grating which is obtained via annealing under high temperature as the sensitive element. Thus the grating won't be erased at high temperature. In the present invention, the magnetron sputtering method, which ensures better bonding between the optical fibers and metals, is used to form the adhesive layer and the conductive layer on the surfaces of the optical fibers. The process is performed in an anhydrous environment and without coarsing and sensitization processes normally used in electroless plating so that the little damage is caused to the optical fiber. After the magnetron sputtering, the electroplating method is used to thicken and deposit the protective layer and embed the optical fiber into the flexible metallic substrate. Thereby, the metallic packaging is realized without using any organic polymer material during the whole process, which ensures the sensor can be used at high temperature and improves the temperature sensitivity and the strain sensitivity. Furthermore, the flexible metallic substrate also improves the strain transfer efficiency and is convenient to install.

DETAILED DESCRIPTION OF THE PREFERRED EMBODIMENTS

The advantages of the invention are illustrated in detail by referring the accompanying drawings and embodiments.

Figure 1:
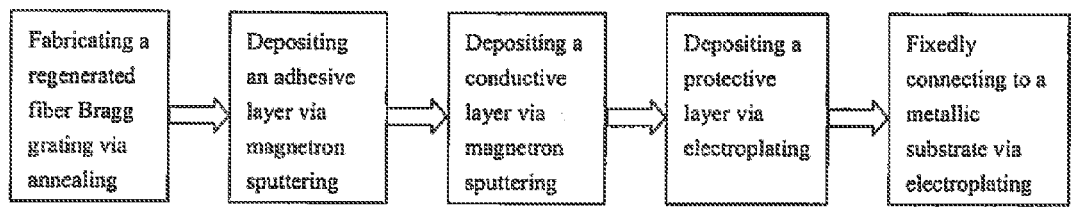
FIG. 1 shows a flowchart of manufacturing a high-temperature-resistant metal-packaged fiber Bragg grating sensor according to the present invention.

FIG. 1 shows a flowchart of manufacturing a high-temperature-resistant metal-packaged fiber Bragg grating sensor according to the present invention, wherein the steps include:

1) Obtaining a regenerated fiber Bragg grating via annealing treatment on a fiber Bragg grating.

In order to avoid grating being "erased" at high temperature, a commercial fiber Bragg grating needs to be annealed to fabricate a high-temperature-resistant regenerated fiber Bragg grating, which specific process parameters are shown in Table 1.

TABLE 1

| Annealing temperature (° C.) | Annealing time (min) |
| --- | --- |
| 850-1000 | 30-120 |

After the annealing, the regenerated fiber Bragg grating can withstand temperature up to 1000° C., and organic material coatings in and around the grating area have been removed completely.

2) Depositing an adhesive layer by magnetron sputtering, a conductive layer by magnetron sputtering, and a protective layer by electroplating on surface of the regenerated fiber Bragg grating in turn.

Nickel has excellent physical, chemical and mechanical properties and good high-temperature properties, thereby providing a good protection. So the present invention selects electroplated nickel (Ni) as the protective layer. Of course, chromium (Cr) with properties similar to those of nickel may also be chosen as the protective layer.

Silica (SiO2), the major constituent of an optical fiber, is a kind of inorganic non-metallic material. Normally, the bonding between metal particles and a metallic substrate is good, and the bonding between metal particles and a non-metallic substrate is poor. However, some kinds of metals, like oxophilic metals, such as titanium (Ti) and chromium (Cr), have a good bonding with oxides. So these metals can be used as the adhesive layer to improve the bonding between metal materials and nonmetal materials between which the bonding is usually weak. Unfortunately, since the electrical conductivity of titanium and chromium is poor, it is difficult to electroplate directly to obtain the sufficient thickness coating for protection. Thus a film of silver (Ag), gold (Au) or molybdenum (Mo) with a good electrical conductivity is firstly formed on the surface of titanium or chromium in order to obtain a conductive layer, and then titanium or chromium is electroplated on the surface of the conductive layer.

The magnetron sputtering is based on sputtering effect produced by energetic ions bombarding a target. The whole sputtering process is established on the base of glow discharge, that is to say, the sputtering ions are all from gas discharge. The magnetron sputtering has many advantages, such as, 1) any material can be sputtered, especially elements and compounds with high melting points and low vapour pressure; 2) the bonding between sputtered films and substrates is good; 3) sputtered films have high density, less pinholes and high purity; 4) the controllability and repeatability of the thickness of sputtered films is good. Accordingly, in the present invention, the magnetron sputtering method is used to form the adhesive layer and the conductive layer.

The processes, the apparatus and parameters of the magnetron sputtering and the electroplating are respectively described in detail as follows.

Figure 2:
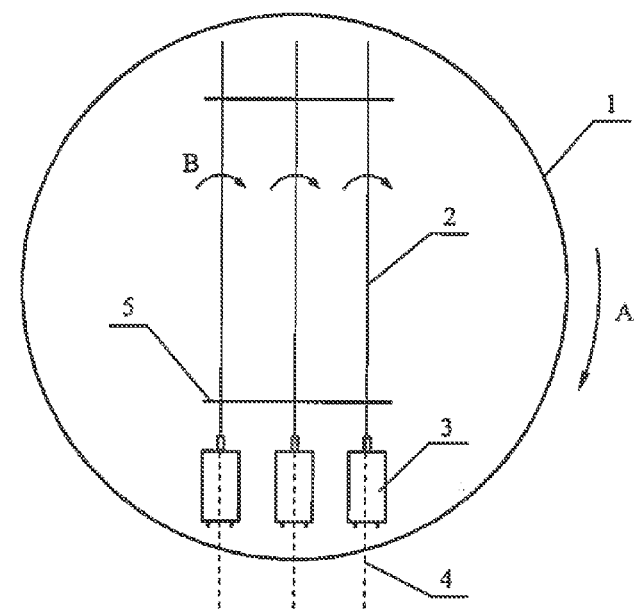
FIG. 2 shows a magnetron sputtering apparatus for manufacturing the high-temperature-resistant metal-packaged fiber Bragg grating sensor according to the present invention.

At first, take a segment of optical fibers with a length of about 250 mm containing a grating, which is fixed in the magnetron sputtering apparatus shown in FIG. 2. In order to achieve uniform films on the cylinder surface of the optical fiber by sputtering, a conventional magnetron sputtering apparatus is modified herein. As shown in FIG. 2, a disk 1 for fixing a magnetron sputtering substrate is the basic component of the conventional magnetron sputtering apparatus. The disk 1 rotates around its center in the direction of the arrow A in FIG. 2 to achieve the uniform films on the flat surface of the substrate on the disk 1. Different from the conventional processes, the present disk 1 is provided with a group of motors 3 and the optical fibers 2 are fixedly connected with shafts 4 of the motors 3 in the direction of the shafts 4 of the motors 3. Moreover, the optical fibers 2 are ensured parallel to a surface of the disk 1 and the grating area is located in the center of the disk 1. During the sputtering, the motors 3 drive the optical fibers 2 to rotate around the shafts 4 as shown by the arrows B, and at the same time, the optical fibers 2 rotate around the center of the disk 1 with the rotation of disk 1 as shown by the arrow A, thereby ensuring the uniform thickness of the film deposited in the process of magnetron sputtering. For avoiding that the slender optical fibers 2 have too large bending deflection, two protective sleeves 5 can be used to support and fix them. After that, the optical fibers 2 are cleaned with acetone. It is considered to be clean until no any residual liquid drop when the acetone liquid flows down the optical fibers. Then an adhesive layer and a conductive layer are deposited on the clean surfaces of the optical fibers in turn by magnetron sputtering. Here, magnetron-sputtered titanium is taken as an example of the adhesive layer and magnetron-sputtered silver is taken as an example of the conductive layer, and the specific process parameters are shown in Table 2. In a preferred embodiment, the total thickness of the obtained titanium layer and silver layer is about 1 μm.

TABLE 2

| | Sputtering power (W) | Gas pressure (Pa) | Temperature (° C.) | Time (min) |
|---|---|---|---|---|
| magnetron sputtering titanium | 120-180 | 0.5-0.8 | Room temperature | 60-150 |
| magnetron sputtering silver | 70-90 | 0.4-0.75 | Room temperature | 10-60 |

Figure 3:
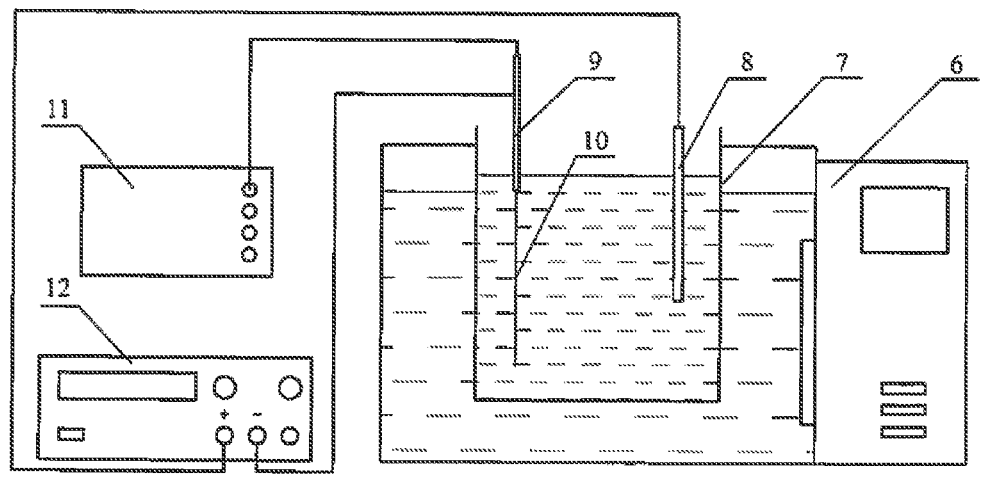
FIG. 3 shows an electroplating apparatus for manufacturing the high-temperature-resistant metal-packaged fiber Bragg grating sensor according to the present invention.

Next, an optical fiber fusion splicer is used to splice the magnetron-sputtered optical fiber to a pigtail. The spliced optical fiber is rinsed with acetone again and then connected to the electroplating apparatus shown in FIG. 3. As shown in FIG. 3, the spliced optical fiber 10 is fixedly inserted in a thin copper tube 9 and the grating is ensured not to be inserted in the thin copper tube 9. The cathode of a power source 12 is connected to the thin copper tube 9 and the anode thereof is connected to a nickel plate 8. The nickel plate 8 and the portion to be electroplated of the optical fiber 10 containing the grating which stays out of the thin copper pipe 9 are immersed into a plating solution in a plating bath 7. The plating bath 7 is placed in a constant temperature water bath 6 so as to control the temperature of the plating solution. While another end of the optical fibers, which isn't immersed in the plating solution is connected to a fiber Bragg grating interrogator 11. The electroplating apparatus can not only solve the problem that the optical fibers are difficult to be fixedly connected during the electroplating, but also measure the stress generated during the electroplating in real-time via the fiber Bragg grating interrogator 11. Electroplated Nickel is taken as an example of the protective layer. To avoid the optical fiber fracture caused by large thermal stress at high temperature, a special high-stress nickel electroplating process is applied in which the electroplating residual stress is increased by adjusting the electric current density and the plating temperature. The optimized process parameters are shown in Table 3, wherein the thickness of the nickel layer is about 250 μm in a preferred embodiment.

TABLE 3

| Concentration of nickel sulfate hexahydrate (g/L) | 250-300 |
|---|---|
| Concentration of nickel chloride hexahydrate (g/L) | 20-40 |
| Concentration of boric acid (g/L) | 35-40 |
| Concentration of sodium dodecyl sulfate (g/L) | 0.3-2 |
| Temperature of plating solution (° C.) | 25-35 |
| Electric current density (A/dm$^2$) | 6-12 |
| Electroplating time (min) | 30-300 |

3) Connecting the regenerated fiber Bragg grating obtained in the step 2) and a metallic substrate fixedly to obtain the fiber Bragg grating sensor.

Figure 4:
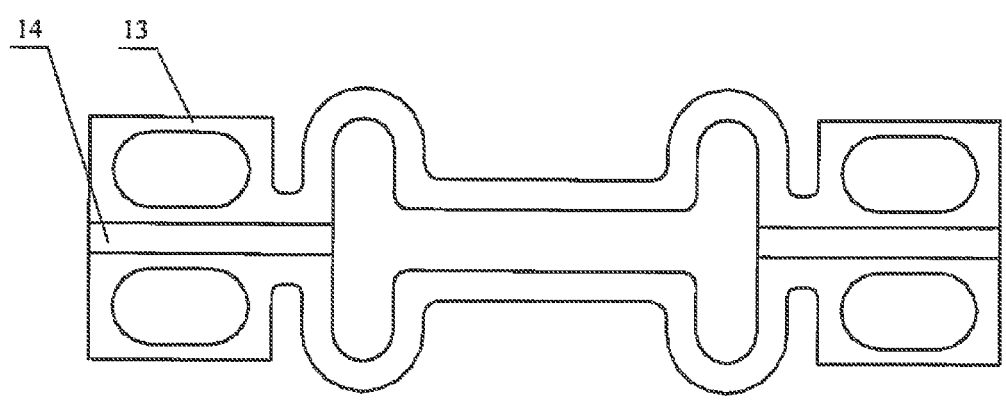
FIG. 4 shows a metallic substrate of the high-temperature-resistant metal-packaged fiber Bragg grating sensor according to the present invention.

In order to be mounted onto a measured metallic component conveniently and improve the strain transfer efficiency, the metal-coated optical fibers should be connected to a metallic substrate, for example, embedded in a metallic substrate 13 with a groove 14 by electroplating shown in FIG. 4. The metallic substrate 13 is optimized flexible structure made of heat-resistant steel or high-temperature alloy. Except the groove 14, the other portion of the substrate 13 may be covered by resistance coating paint so as not to be electroplated. Alternatively, the metalized optical fibers may be connected with the metallic substrate by brazing. The metallic substrate may be provided with elliptical countersinks to achieve connection with the measured metallic components by such simple and reliable methods, such as spot-welding. The heat-resistant steel or high-temperature alloy is a metal material adapting to operating at high temperature, with excellent high-temperature oxidation resistance, high-temperature corrosion resistance and creep resistance, sufficient high-temperature durable strength, high-temperature fatigue resistance and suitable high-temperature plasticity. A low-stress plating process is applied in the embedding process and the optimized process parameters are shown in Table 4.

TABLE 4

| Concentration of nickel sulfate hexahydrate (g/L) | 250-300 |
|---|---|
| Concentration of nickel chloride hexahydrate (g/L) | 20-40 |
| Concentration of boric acid (g/L) | 35-40 |
| Concentration of sodium dodecyl sulfate (g/L) | 0.3-2 |
| Temperature of plating solution (° C.) | 25-55 |
| Electric current density (A/dm$^2$) | 1-5 |

The fiber Bragg grating sensor obtained through the above steps includes the regenerated fiber Bragg grating and the metallic substrate fixedly connected with the regenerated fiber Bragg grating. The adhesive layer, the conductive layer and the protective layer are deposited in turn on the surface of the regenerated fiber Bragg grating. The adhesive layer is a titanium layer or a chromium layer, the conductive layer is silver, gold or molybdenum layer and the protective layer is nickel layer or a chromium layer.

Because the regenerated fiber Bragg grating which is obtained via high temperature annealing is used as a sensitive element, the grating won't be erased when used at high temperature. The magnetron sputtering method that ensures good bonding between the optical fibers and metals is used to deposit the adhesive layer and the conductive layer on the surfaces of the optical fibers. Since the magnetron sputtering is performed in an anhydrous environment and without surface coarsening and sensitization processes etc. of electroless plating, the little damage is caused to the optical fibers. After the magnetron sputtering, the electroplating method is used to thicken and deposit the protective layer and embed the optical fibers into the flexible metallic substrate thereby achieving the whole metallic package. During the whole process, no organic polymer adhesive is used so that the application of the sensor at high temperature is ensured and the temperature sensitivity and the strain sensitivity are improved. Furthermore, the metallic substrate with a flexible structure also improves the strain transfer efficiency and is convenient to install.

Figure 5:
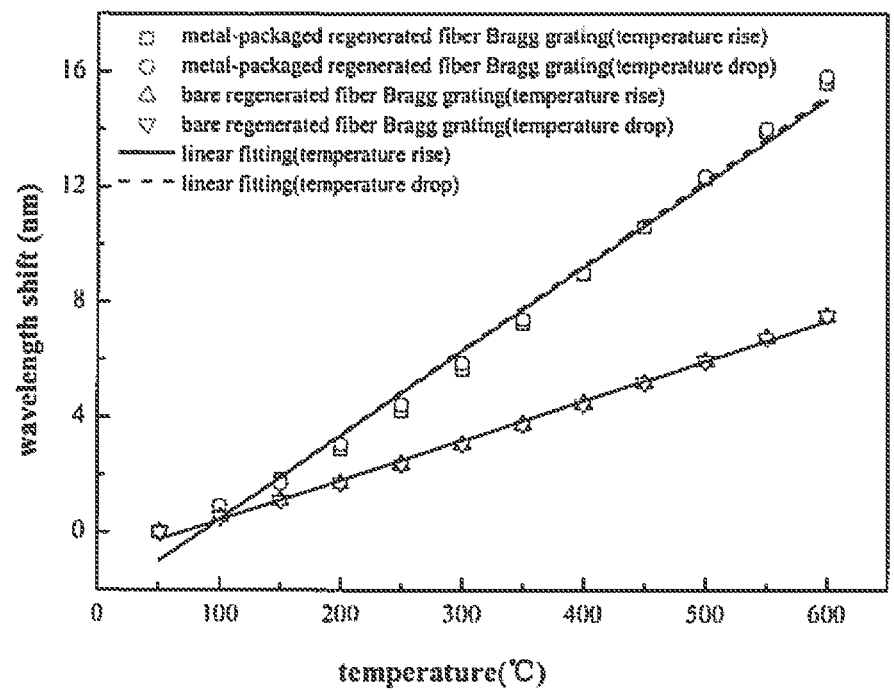
FIG. 5 shows a comparison of temperature characteristics between the high-temperature-resistant metal-packaged fiber Bragg grating sensor according to the present invention and a bare regenerated fiber Bragg grating.

FIG. 5 shows a comparison of temperature characteristics between the high-temperature-resistant metal-packaged fiber Bragg grating sensor of the present invention and a bare regenerated fiber Bragg grating. The temperature sensitivity is about 13.8 pm/° C. for the latter and 30 pm/° C. for the former which temperature sensitivity is almost 2.1 times as much as that of the bare regenerated fiber Bragg grating. Moreover, the coefficient of determination is very high ($R^2$>0.99), indicating a strong linear relationship between the wavelength shift of the present high-temperature-resistant metal-packaged fiber Bragg grating sensor and the temperature. Apparently, the high-temperature-resistant metal-packaged fiber Bragg grating sensor according to the present invention can be used below 600° C. and has excellent temperature sensing characteristics in the temperature range 20° C.-600° C.

Figure 6:
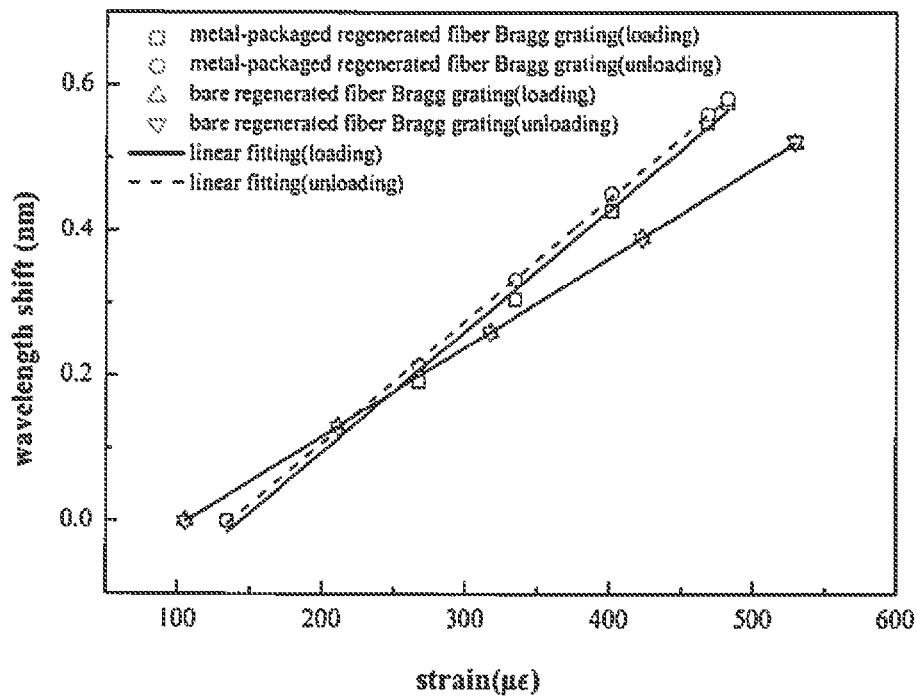
FIG. 6 shows a comparison of strain characteristics at high temperature between the high-temperature-resistant metal-packaged fiber Bragg grating sensor according to the present invention and a bare regenerated fiber Bragg grating.

FIG. 6 shows a comparison of strain characteristics at high-temperature between the high-temperature-resistant metal-packaged fiber Bragg grating sensor of the present invention and a bare regenerated fiber Bragg grating. The strain sensitivity is about 1.23 pm/µε for the latter and 1.67 pm/µε for the former which strain sensitivity is almost 1.3 times as much as that of the latter. It is shown that the high-temperature-resistant metal-packaged fiber Bragg grating sensor has high strain sensitivity and high strain transfer efficiency. Moreover, the coefficient of determination is very high ($R^2$>0.99), indicating a strong linear relationship between the wavelength shift of the present high-temperature-resistant metal-packaged fiber Bragg grating sensor and the strain. Accordingly, the high-temperature-resistant metal-packaged fiber Bragg grating sensor according to the present invention can be applied to strain measurement at high temperature.

What are disclosed above are only the preferred embodiments of the present invention and it is therefore not by intention to limit the present invention to the particular embodiments disclosed. It will be understood by those skilled in the art that various equivalent changes may be made depending on the attached claims and the specification of present invention without departing from the scope of the present invention.

What is claimed is:

1. A manufacturing method for a high-temperature-resistant metal-packaged fiber Bragg grating sensor, comprising steps of:
   1) obtaining a regenerated fiber Bragg grating via annealing on a fiber Bragg grating;
   2) depositing an adhesive layer by magnetron sputtering, a conductive layer by magnetron sputtering, and a protective layer by electroplating on surface of the regenerated fiber Bragg grating in turn;
   3) fixedly connecting the regenerated fiber Bragg grating obtained in the step 2) to a metallic substrate to obtain a fiber Bragg grating sensor; wherein
   in the step 1), the process parameters for annealing include an annealing temperature of 850-1000° C. and an annealing time of 30-120 minutes.

2. The manufacturing method as claimed in claim 1, wherein in the step 2), the adhesive layer is deposited by magnetron sputtering titanium or chromium, the conductive layer is deposited by magnetron sputtering silver, gold or molybdenum and the protective layer is deposited by electroplating nickel or chromium.

3. The manufacturing method as claimed in claim 2, wherein in the step 2), the process parameters for magnetron sputtering titanium include a sputtering power of 120-180 W, a gas pressure of 0.5-0.8 Pa, a process temperature of room temperature, and a process time of 60-150 minutes, and wherein in the step 2), the process parameters for magnetron sputtering silver include a sputtering power of 70-90 W, a gas pressure of 0.4-0.75 Pa, a process temperature of room temperature, and a process time of 10-60 minutes.

4. The manufacturing method as claimed in claim 2, wherein in the step 2), the process parameters for electroplating nickel include a concentration of nickel sulfate hexahydrate of 250-300 g/L, a concentration of nickel chloride hexahydrate of 20-40 g/L, a concentration of boric acid of 34-40 g/L, a concentration of sodium dodecyl sulfate of 0.3-2 g/L, a temperature of plating solution of 25-35° C., an electric current density of 6-12 A/dm$^2$, and an electroplating time of 30-300 minutes.

5. The manufacturing method as claimed in claim 2, wherein in the step 3), the regenerated fiber Bragg grating obtained in the step 2) is fixedly connected to the metallic substrate by electroplating.

6. The manufacturing method as claimed in claim 5, wherein in the step 3), the process parameters for electroplating include a concentration of nickel sulfate hexahydrate of 250-300 g/L, a concentration of nickel chloride hexahydrate of 20-40 g/L, a concentration of boric acid of 35-40 g/L, a concentration of sodium dodecyl sulfate of 0.3-2 g/L, a temperature of plating solution of 25-55° C., and an electric current density of 1-5 A/dm$^2$.

7. The manufacturing method as claimed in claim 2, wherein in the step 3), the regenerated fiber Bragg grating obtained in the step 2) is fixedly connected to the metallic substrate by brazing.

8. The manufacturing method as claimed in claim 1, wherein in the step 3), the regenerated fiber Bragg grating obtained in the step 2) is fixedly connected to the metallic substrate by electroplating.

9. The manufacturing method as claimed in claim 8, wherein in the step 3), the process parameters for electroplating include a concentration of nickel sulfate hexahydrate of 250-300 g/L, a concentration of nickel chloride hexahydrate of 20-40 g/L, a concentration of boric acid of 35-40 g/L, a concentration of sodium dodecyl sulfate of 0.3-2 g/L, a temperature of plating solution of 25-55° C., and an electric current density of 1-5 A/dm$^2$.

10. The manufacturing method as claimed in claim 1, wherein in the step 3), the regenerated fiber Bragg grating obtained in the step 2) is fixedly connected to the metallic substrate by brazing.

11. A high-temperature-resistant metal-packaged fiber Bragg grating sensor, comprising:

a regenerated fiber Bragg grating, on a surface of which an adhesive layer, a conductive layer and a protective layer are deposited in turn; and a metallic substrate, fixedly connected with the regenerated fiber Bragg grating.

12. The high-temperature-resistant metal-packaged fiber Bragg grating sensor as claimed in claim 11, wherein the adhesive layer is a titanium layer or a chromium layer, the conductive layer is a silver layer, a gold layer or a molybdenum layer, and the protective layer is a nickel layer or a chromium layer.

13. The high-temperature-resistant metal-packaged fiber Bragg grating sensor as claimed in claim 12, wherein the metallic substrate has a flexible structure.

14. The high-temperature-resistant metal-packaged fiber Bragg grating sensor as claimed in claim 12, wherein the metallic substrate is made of heat-resistant steel or high-temperature alloy.

15. The high-temperature-resistant metal-packaged fiber Bragg grating sensor as claimed in claim 11, wherein the metallic substrate has a flexible structure.

16. The high-temperature-resistant metal-packaged fiber Bragg grating sensor as claimed in claim 11, wherein the metallic substrate is made of heat-resistant steel or high-temperature alloy.

* * * * *